(12) United States Patent
Shone

(10) Patent No.: US 7,033,890 B2
(45) Date of Patent: Apr. 25, 2006

(54) ONO FORMATION METHOD

(75) Inventor: Fuja Shone, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 0 days.

(21) Appl. No.: 11/138,363

(22) Filed: May 27, 2005

(65) Prior Publication Data
US 2005/0233528 A1   Oct. 20, 2005

Related U.S. Application Data

(62) Division of application No. 10/809,891, filed on Mar. 26, 2004, now abandoned.

(51) Int. Cl.
H01L 21/8247 (2006.01)

(52) U.S. Cl. ................................ 438/261; 438/954
(58) Field of Classification Search ........ 438/257–267, 438/954
See application file for complete search history.

(56) References Cited

U.S. PATENT DOCUMENTS

| 4,720,323 | A |   | 1/1988  | Sato              |         |
|-----------|---|---|---------|-------------------|---------|
| 5,168,334 | A |   | 12/1992 | Mitchell et al.   |         |
| 5,665,620 | A | * | 9/1997  | Nguyen et al.     | 438/593 |
| 5,836,772 | A |   | 11/1998 | Chang et al.      |         |
| 5,856,221 | A | * | 1/1999  | Clementi et al.   | 438/258 |
| 5,966,603 | A |   | 10/1999 | Eitan             |         |
| 6,297,096 | B1|   | 10/2001 | Boaz              |         |
| 6,406,960 | B1|   | 6/2002  | Hopper et al.     |         |

* cited by examiner

Primary Examiner—Richard A. Booth
(74) Attorney, Agent, or Firm—Volentine Francos & Whitt, PLLC

(57) ABSTRACT

An ONO formation method comprises the following procedures. First, a bottom oxide layer is formed on a silicon substrate, and then a silicon-rich nitride layer is deposited on the bottom oxide layer. Then, an oxidation process is performed to react with silicon atoms in the silicon-rich nitride layer, so as to form a top oxide layer. Alternatively, the silicon-rich layer can be replaced with a combination of a nitride layer and a polysilicon layer. The oxidation process can consume the polysilicon layer into the top oxide layer, and proper oxygen is introduced into the nitride layer.

4 Claims, 7 Drawing Sheets

US 7,033,890 B2

ONO FORMATION METHOD

CROSS-REFERENCE TO RELATED APPLICATIONS

This is a divisional of, and a claim of priority is made to, U.S. non-provisional application Ser. No. 10/809,891, filed Mar. 26, 2004 abandonded.

BACKGROUND OF THE INVENTION (A) Field of the Invention

The present invention is related to a method for forming a dielectric layer in a non-volatile memory device, more specifically, to a formation method of an oxide-nitride-oxide (ONO) layer.

(B) Description of the Related Art

Non-volatile memory devices are currently in wide use in electronic components that require the retention of information when electrical power is terminated. Non-volatile memory devices include read only memory (ROM), programmable read only memory (PROM), erasable programmable read only memory (EPROM) and electrically erasable programmable read only memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. In a flash EEPROM device, electrons are transferred to a floating-gate electrode through a dielectric layer overlying the channel region of the transistor. The electron transfer is initiated by either hot electron injection or Fowler-Nordheim tunneling. One important dielectric material for the fabrication of the floating-gate electrode is an ONO structure. During programming, electrical charges are transferred from the substrate to the silicon nitride layer in the ONO structure and trapped therein. Nowadays, the ONO structure is in wide use in non-volatile memory devices.

The ONO formation described in U.S. Pat. No. 5,168,334 is shown in FIG. 1, which is most commonly used. A bottom oxide layer 102 is thermally grown over the surface of a silicon substrate 101, and then an overlying layer 103 of silicon nitride is deposited to a thickness of around 200 angstroms. Next, a top oxide layer 104 is deposited on the silicon nitride layer 103, thereby an ONO layer 10 is formed.

U.S. Pat. Nos. 5,966,603 and 6,297,096 reveal another way of ONO formation. As shown in FIG. 2(a), a bottom oxide layer 202 is thermally grown on a silicon substrate 201, followed by depositing a silicon nitride layer 203. As shown in FIG. 2(b), an oxidation process is conducted to consume a part of the silicon nitride layer 203 into a top oxide layer 204, thereby an ONO layer 20 including the bottom oxide layer 202, the nitride layer 203 and the top oxide layer 204 is formed. It is noted that typically half of the thickness of the top oxide layer 204 comes from the consumed nitride layer 203. Thus, for instance, if it is desired to have a top oxide layer 204 of a thickness with around 100 angstroms, the silicon nitride layer 203 should be at least 50 angstroms thicker than the final desired nitride thickness, with the extra nitride being for consumption of the top oxide layer 204.

However, the top oxide layer 104 formed by deposition may incur oxide quality issue that is harmful to isolation, and the method that the top oxide layer 204 formed by oxidation may be not be able to easily control the thickness of the nitride layer 203. Therefore, it is necessary to develop other ONO formation methods for resolving the above-mentioned problems.

SUMMARY OF THE INVENTION

The objective of the present invention is to provide a method of forming an ONO layer in a non-volatile memory device, with a view to increasing process flexibility and obtaining a thicker top oxide layer of the ONO layer for specific process requirements.

To achieve the above objective, an ONO formation method has been developed. First, a bottom oxide layer is formed on a silicon substrate, and then a silicon-rich nitride layer is deposited on the bottom oxide layer. Then, an oxidation process is performed to react with silicon atoms in the silicon-rich nitride layer, so as to form a top oxide layer.

Alternatively, the silicon-rich layer can be replaced with a combination of a nitride layer and a polysilicon layer. The oxidation process can consume the polysilicon layer into the top oxide layer, and proper oxygen is introduced into the nitride layer.

In addition, a first oxide layer may be formed before oxidation to be a part of the top oxide layer, thereby a thicker top oxide layer of the ONO layer can be obtained. The first oxide layer may be formed by low-pressure chemical vapor deposition (LPCVD) or use high-temperature oxide (HTO).

DETAILED DESCRIPTION OF THE INVENTION

Embodiments of the present invention are now being described with reference to the accompanying drawings.

Figure 1:
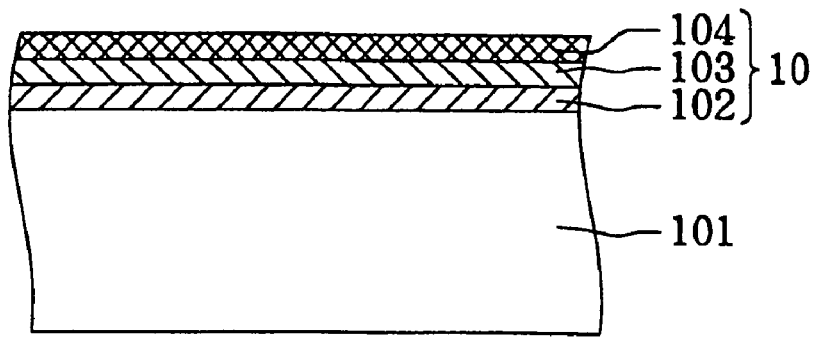
FIG. 1 illustrates a known ONO formation method.
Figure 2A:
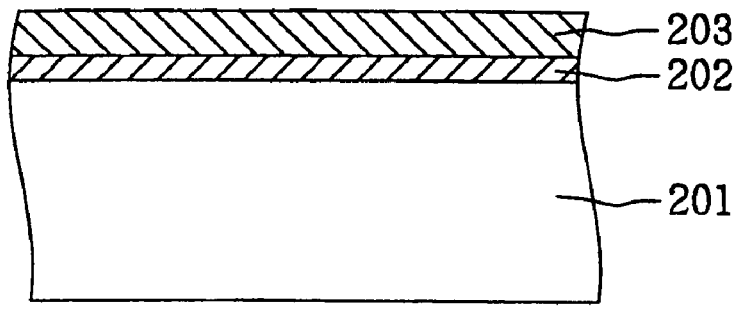
FIGS. 2(a) and 2(b) illustrate another known ONO formation method.
Figure 2B:
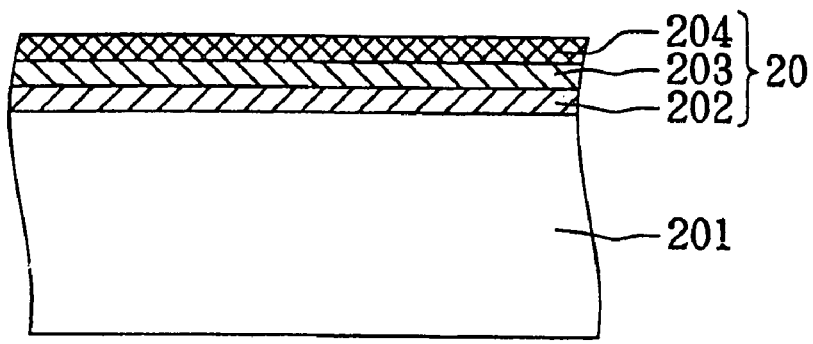
Figure 3A:
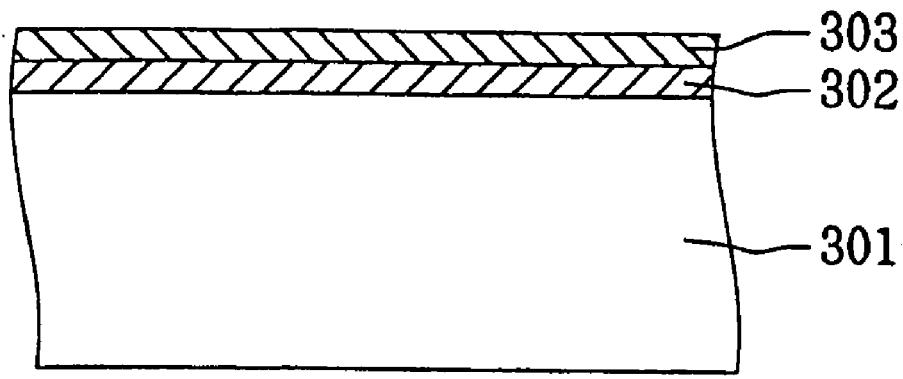
FIGS. 3(a) and 3(b) illustrate the first embodiment of the ONO formation method in accordance with the present invention.
Figure 3B:
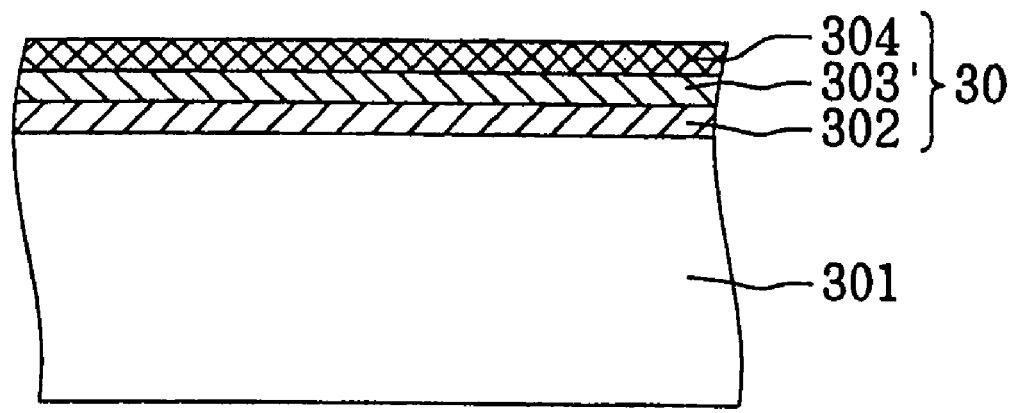

FIGS. 3(a) and 3(b) illustrate the first embodiment of the ONO formation method in accordance with the present invention. In FIG. 3(a), a bottom oxide layer 302 typically of 10–100 angstroms is formed on a silicon substrate 301 in which the bottom oxide layer 302 may be fabricated by oxidation in a furnace. Then, a silicon-rich nitride layer 303 typically of 10–200 angstroms is deposited on the bottom oxide layer 302. As shown in FIG. 3(b), an oxidation process at a temperature of 700–1100° C. is then conducted to introduce proper oxygen into the silicon-rich nitride layer 303, thereby a top oxide layer 304 ranging from 20 to 200 angstroms is formed by consuming extra silicon atoms in the silicon-rich nitride layer 303. Accordingly, the silicon-rich nitride layer 303 may be transformed into a thinner nitride layer 303' of less silicon concentration. Nevertheless, the thickness of the nitride layer 303' is not far less than that of the silicon-rich nitride layer 303 due to the high concentration of silicon atoms in the silicon-rich nitride layer 303. As a result, an ONO layer 30 including the bottom oxide layer 302, the nitride layer 303' and the top oxide layer 304 is formed.

Figure 4A:
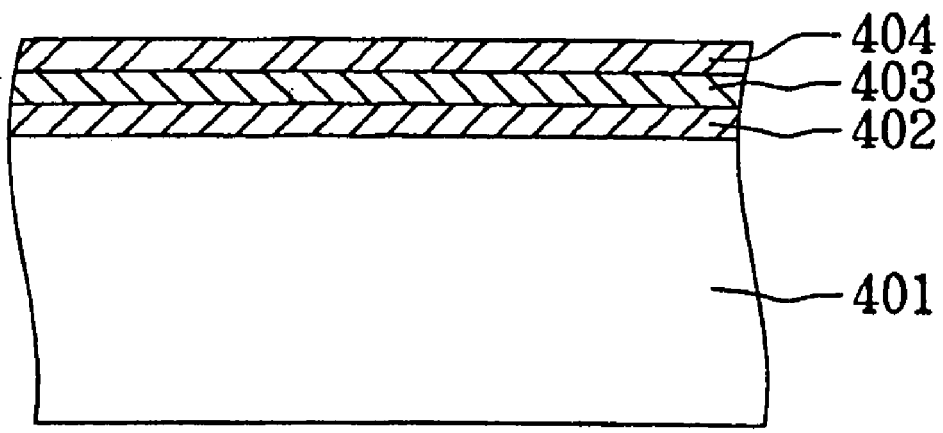
FIGS. 4(a) and 4(b) illustrate the second embodiment of the ONO formation method in accordance with the present invention.
Figure 4B:
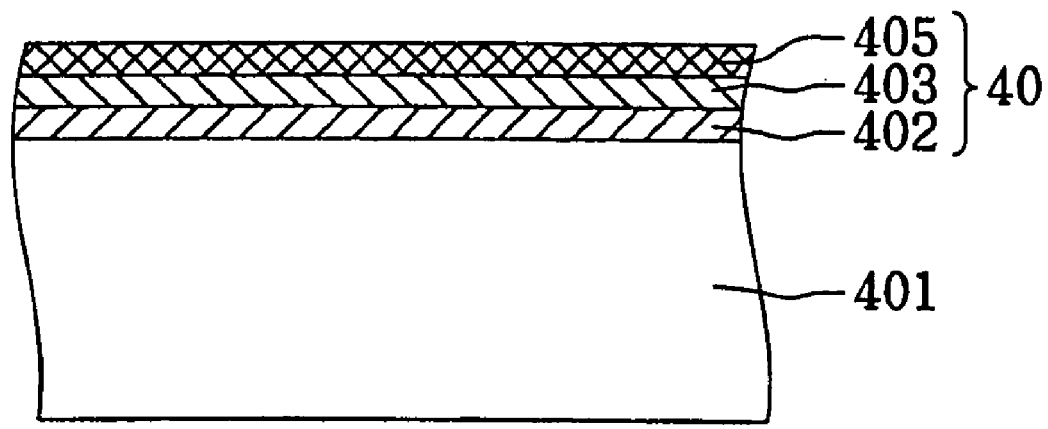

The second embodiment of the ONO formation method in accordance with the present invention is shown in FIGS. 4(a) and 4(b). In FIG. 4(a), a bottom oxide layer 402 ranging from 10 to 100 angstroms is formed on a silicon substrate 401, and then a nitride layer 403 ranging from 10 to 200 angstroms and a polysilicon layer 404 ranging from 10 to 100 angstroms are deposited in sequence. As shown in FIG. 4(b), an oxidation process at a temperature of 700–1100° C. is then conducted to consume the polysilicon layer 404 into a top oxide layer 405 ranging from 20 to 200 angstroms, and proper oxygen is introduced into the nitride layer 403 during the oxidation process. Accordingly, an ONO layer 40 including the bottom oxide layer 402, the nitride layer 403 and the top oxide layer 405 is formed.

Figure 5A:
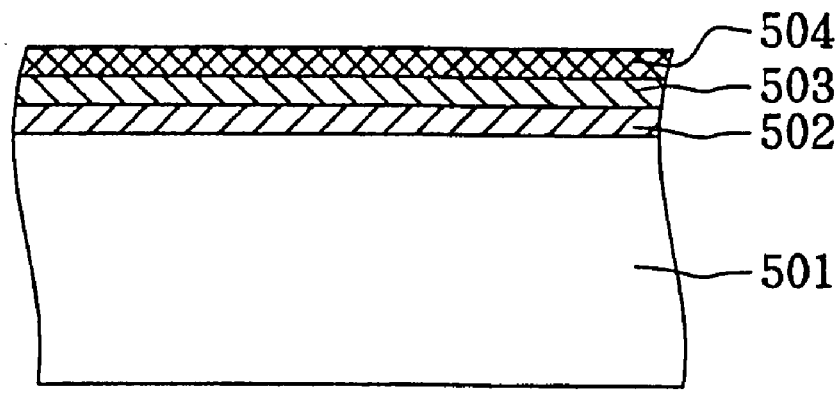
FIGS. 5(a) and 5(b) illustrate the third embodiment of the ONO formation method in accordance with the present invention.
Figure 5B:
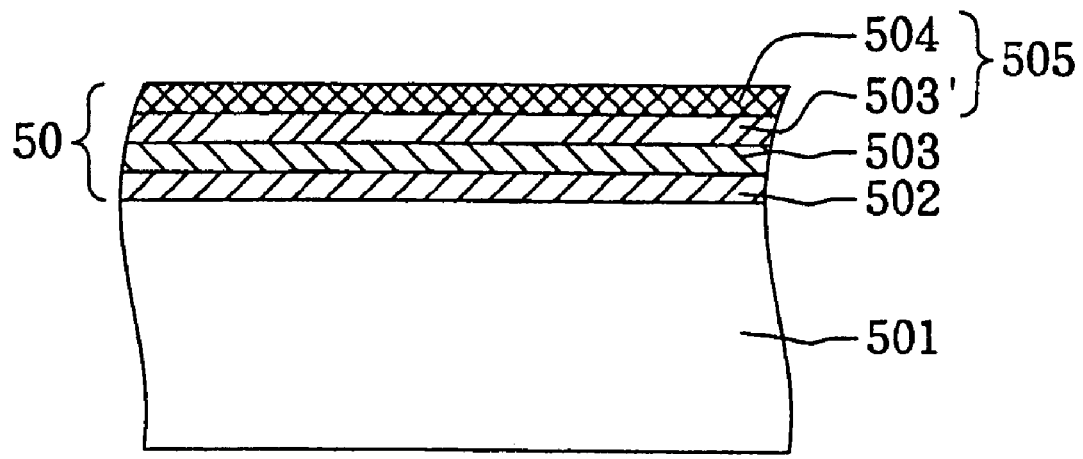

The third embodiment of the ONO formation method in accordance with the present invention is shown in FIGS. 5(a) and 5(b). In FIG. 5(a), a bottom oxide layer 502 ranging from 10 to 100 angstroms is formed on a silicon substrate 501, and then a silicon-rich nitride layer 503 ranging from 10 to 200 angstroms and a first oxide layer 504 are deposited in sequence. As shown in FIG. 5(b), an oxidation process at a temperature of 700–1100° C. is then conducted to consume extra silicon atoms in the silicon-rich nitride layer 503, so as to form a second oxide layer 503'. The second oxide layer 503' together with the first oxide layer 504 form a top oxide layer 505 ranging from 20 to 200 angstroms, and thus the top oxide layer 505 is thicker than the first oxide layer 504. The first oxide layer may be formed by LPVCD or made of HTO, i.e., thermally formed in a temperature between 500–800° C. Accordingly, an ONO layer 50 including the bottom oxide layer 502, the nitride layer 503 and the top oxide layer 505 is formed. In comparison with the above-mentioned first embodiment, the first oxide layer 504 added before oxidation is to attain a thicker top oxide layer, so as to meet specific requirements and enhance process flexibility.

Figure 6A:
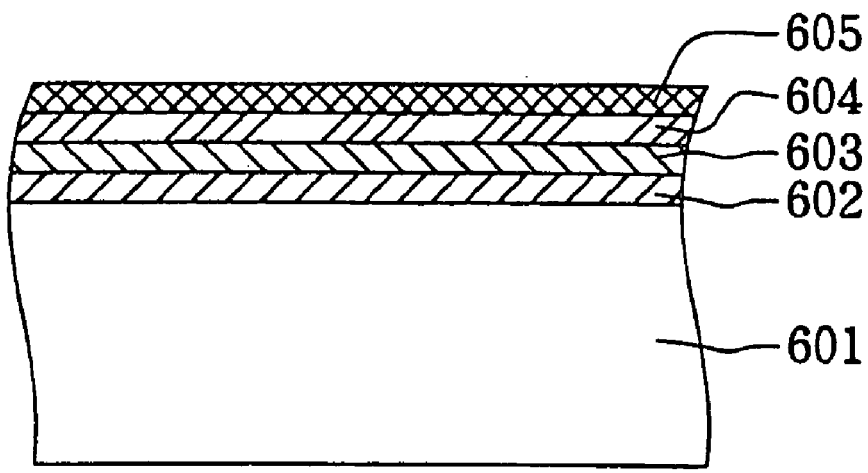
FIGS. 6(a) and 6(b) illustrate the fourth embodiment of the ONO formation method in accordance with the present invention.
Figure 6B:
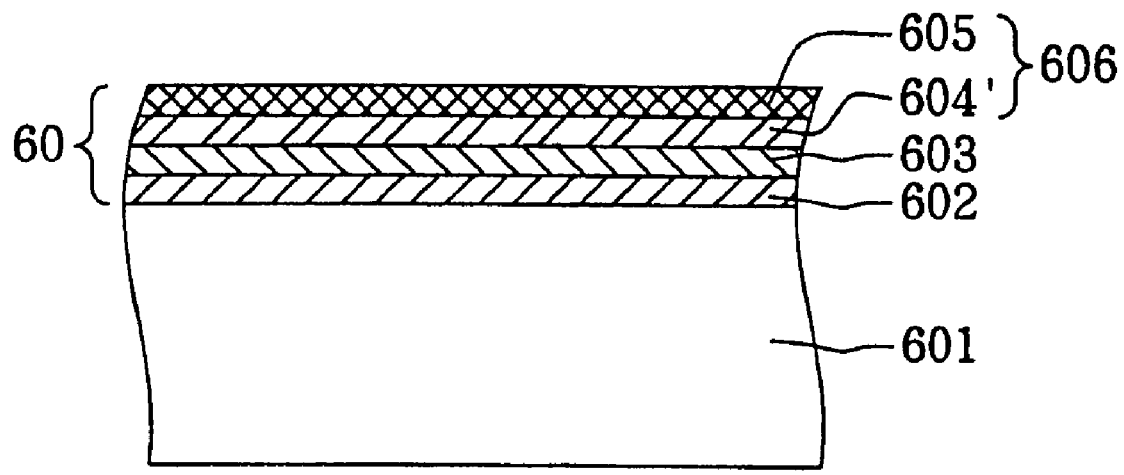

FIGS. 6(a) and 6(b) illustrate the fourth embodiment of the ONO formation method put forth in the present invention. A bottom oxide layer 602 ranging from 10 to 100 angstroms is formed over the surface of a silicon substrate 601, and a nitride layer 603 ranging from 10 to 100 angstroms, a polysilicon layer 604 ranging from 10 to 200 angstroms and a first oxide layer 605 ranging from 10 to 100 angstroms are sequentially deposited or grown thereafter. As shown in FIG. 6(b), an oxidation process at a temperature of 700–1100° C. is then conducted to consume polysilicon layer 604 into a second oxide layer 604'. The second oxide layer 604' together with the first oxide layer 605 forms a top oxide layer 606 ranging from 20 to 200 angstroms. As a result, an ONO layer 60 including the bottom oxide layer 602, the nitride layer 603 and the top oxide layer 606 is formed.

Figure 7A:
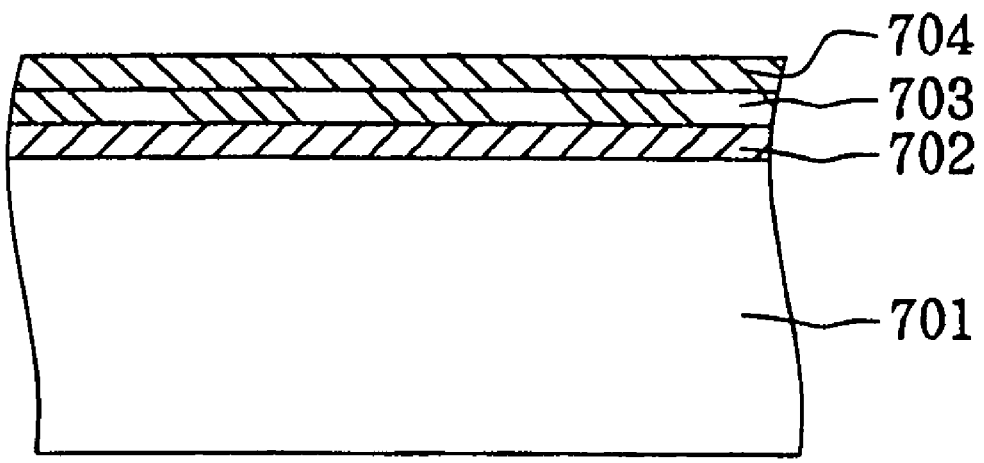
FIGS. 7(a) and 7(b) illustrate the fifth embodiment of the ONO formation method in accordance with the present invention.
Figure 7B:
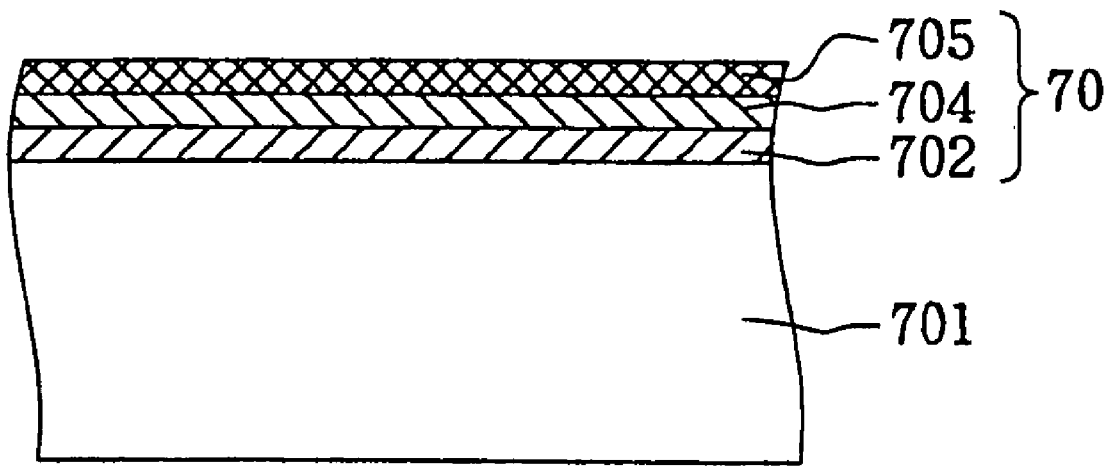

FIGS. 7(a) and 7(b) illustrate the fifth embodiment of the ONO formation method put forth in the present invention. In FIG. 7(a), a bottom oxide layer 702 ranging from 10 to 100 angstroms is formed on a silicon substrate 701, and a polysilicon layer 703 ranging from 10 to 100 angstroms and a nitride layer 704 ranging from 10 to 100 angstroms are sequentially deposited afterwards. As shown in FIG. 7(b), an oxidation process at a temperature of 700–1100° C. is implemented to consume the polysilicon layer 703 into a top oxide layer 705 that is formed on the surface of the nitride layer 704, in which the silicon atoms in the polysilicon layer 703 diffuse through the nitride layer 704 to react with the oxygen in the oxidation process, so as to form the top oxide layer 705. Therefore, the nitride layer 704 cannot be too thick to hinder the penetration of the silicon atoms, and a thickness of 20–50 angstroms or even less is preferred. As a result, an ONO layer 70 including the bottom oxide layer 702, the nitride layer 704 and the top oxide layer 705 is formed.

Figure 8A:
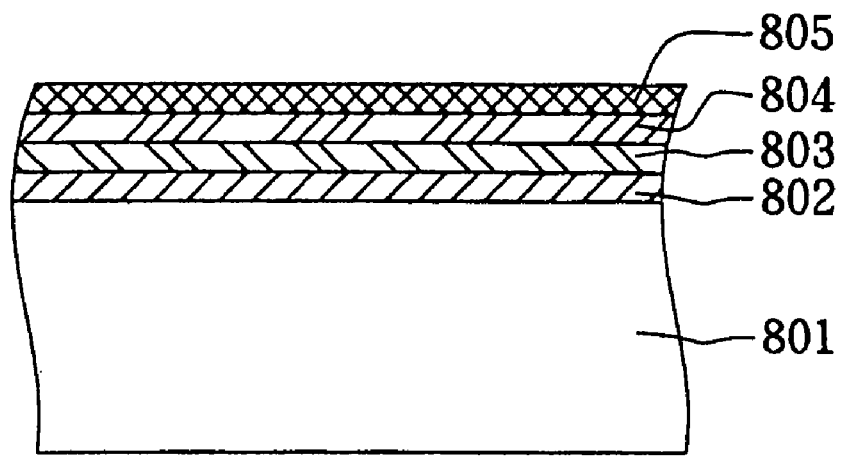
FIGS. 8(a) and 8(b) illustrate the sixth embodiment of the ONO formation method in accordance with the present invention.
Figure 8B:
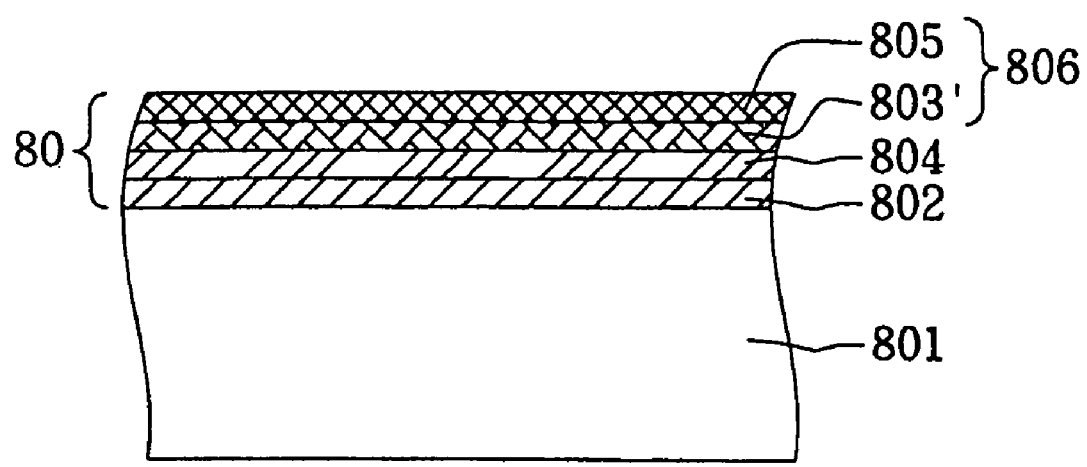

FIGS. 8(a) and 8(b) illustrate the sixth embodiment of the ONO formation method put forth in the present invention. In FIG. 8(a), a bottom oxide layer 802 ranging from 10 to 100 angstroms is formed on a silicon substrate 801, and then a polysilicon layer 803 ranging from 10 to 100 angstroms, a nitride layer 804 ranging from 10 to 100 angstroms and a first oxide layer 805 ranging from 20 to 200 angstroms are sequentially deposited. As shown in FIG. 8(b), an oxidation process is then conducted at a temperature ranging from 700–1000° C. to consume the polysilicon layer 803 into a second oxide layer 803', in which the silicon atoms in the polysilicon layer 803 diffuse through the nitride layer 804 to react with oxygen, so as to form the second oxide layer 803'. The first and second oxide layers 805 and 803' form a top oxide layer 806. As a result, an ONO layer 80 including the bottom oxide layer 802, the nitride layer 804 and the top oxide layer 806 is formed.

Similarly, the objective of adding the first oxide layers 605 and 805 is to provide the thicker top oxide layers 606 and 806, and HTO or LPCVD oxide can be selected as material thereof.

The above-described embodiments of the present invention are intended to be illustrative only. Numerous alternative embodiments may be devised by those skilled in the art without departing from the scope of the following claims.

The invention claimed is:

1. A method for forming an oxide-nitride-oxide layer in a non-volatile memory device, comprising the steps of:
    providing a silicon substrate;
    forming a bottom oxide layer on the silicon substrate;
    depositing a polysilicon layer on the bottom oxide layer;
    depositing a nitride layer on the polysilicon layer; and
    performing an oxidation process so that silicon atoms in the polysilicon layer penetrate through the nitride layer, so as to form a top oxide layer.

2. The method for forming an oxide-nitride-oxide layer in a non-volatile memory device of claim 1, further comprising the step of depositing a first oxide layer on the nitride layer before the oxidation process is performed.

3. The method for forming an oxide-nitride-oxide layer in a non-volatile memory device of claim 2, wherein the first oxide layer is a part of the top oxide layer.

4. The method for forming an oxide-nitride-oxide layer in a non-volatile memory device of claim 1, wherein the nitride layer is of a thickness between 20 and 50 angstroms.

* * * * *